(12) United States Patent
Yuan et al.

(10) Patent No.: US 12,125,936 B2
(45) Date of Patent: Oct. 22, 2024

(54) METHOD FOR PASSIVATING SILICON-BASED SEMICONDUCTOR DEVICE, AND SILICON-BASED SEMICONDUCTOR DEVICE

(71) Applicants: Jinko Green Energy (Shanghai) Management Co., LTD, Shanghai (CN); ZHEJIANG JINKO SOLAR CO., LTD, Zhejiang (CN)

(72) Inventors: Xueting Yuan, Shanghai (CN); Xinyu Zhang, Shanghai (CN)

(73) Assignees: JINKO GREEN ENERGY (SHANGHAI) MANAGEMENT CO., LTD, Shanghai (CN); ZHEJIANG JINKO SOLAR CO., LTD, Zhejiang (CN)

( * ) Notice: Subject to any disclaimer, the term of this patent is extended or adjusted under 35 U.S.C. 154(b) by 62 days.

(21) Appl. No.: 17/036,318

(22) Filed: Sep. 29, 2020

(65) Prior Publication Data
US 2022/0059718 A1    Feb. 24, 2022

(30) Foreign Application Priority Data
Aug. 21, 2020  (CN) .......................... 202010851032.8

(51) Int. Cl.
*H01L 31/18* (2006.01)
*H01L 31/0216* (2014.01)

(52) U.S. Cl.
CPC .... *H01L 31/1868* (2013.01); *H01L 31/02167* (2013.01)

(58) Field of Classification Search
CPC ............. H01L 31/1868; H01L 31/02167
See application file for complete search history.

(56) References Cited

U.S. PATENT DOCUMENTS

| 4,729,006 | A | * | 3/1988 | Dally | ............... H01L 21/76224 |
| | | | | | 257/E21.546 |
| 6,486,476 | B1 | | 11/2002 | Ochiai et al. | |

(Continued)

FOREIGN PATENT DOCUMENTS

| CN | 102544234 | 7/2012 |
| CN | 103928568 | 7/2014 |

(Continued)

OTHER PUBLICATIONS

Goswami, et al., Physical Review B, 68, 033401 (2003) (Year: 2003).*

(Continued)

*Primary Examiner* — Sadie White
(74) *Attorney, Agent, or Firm* — Burris Law, PLLC

(57) ABSTRACT

Provided is a method for passivating a silicon-based semiconductor device and a silicon-based semiconductor device. The method includes the following steps: cutting, by using a cutting process, a preset region of the silicon-based semiconductor device, to form a first surface associated with the preset region; smoothing the first surface to adjust a surface appearance of the first surface, so that a height difference between a protrusion and a recess of a non-marginal region on the first surface is less than 20 nm; and passivating the smoothed first surface to form a first passivation layer on the first surface. The present application can reduce or avoid the problem of efficiency reduction caused by cutting a silicon-based semiconductor device and help to obtain a more efficient silicon-based semiconductor device.

16 Claims, 4 Drawing Sheets

(56) References Cited

U.S. PATENT DOCUMENTS

| | | | | |
|---|---|---|---|---|
| 2003/0194848 | A1* | 10/2003 | Jang | H01L 21/76245 438/424 |
| 2004/0050420 | A1* | 3/2004 | Huang | G01M 3/16 137/312 |
| 2005/0118933 | A1 | 6/2005 | Sakai | |
| 2006/0068567 | A1 | 3/2006 | Beyne et al. | |
| 2006/0183332 | A1* | 8/2006 | Kang | B81C 1/0015 438/712 |
| 2006/0197190 | A1 | 9/2006 | Doan | |
| 2007/0128750 | A1 | 6/2007 | Hsu et al. | |
| 2007/0134825 | A1 | 6/2007 | Zou et al. | |
| 2008/0245408 | A1* | 10/2008 | Ito | H01L 31/068 136/255 |
| 2009/0120457 | A1* | 5/2009 | Naghshineh | G03F 7/425 134/2 |
| 2010/0243040 | A1* | 9/2010 | Kim | H01L 31/02245 136/255 |
| 2011/0114171 | A1* | 5/2011 | Meier | H01L 31/068 136/256 |
| 2011/0256377 | A1* | 10/2011 | Chiruvolu | C30B 29/06 118/316 |
| 2011/0284068 | A1* | 11/2011 | Moslehi | H01L 31/02167 136/256 |
| 2012/0186642 | A1* | 7/2012 | Ballif | H01L 31/056 136/255 |
| 2013/0153018 | A1* | 6/2013 | Lee | H01L 31/02167 136/256 |
| 2013/0284254 | A1* | 10/2013 | Rehder | H01L 31/0693 136/256 |
| 2014/0014175 | A1* | 1/2014 | Ito | H01L 31/022425 136/256 |
| 2015/0228810 | A1* | 8/2015 | Shumate | H01L 31/02168 438/72 |
| 2016/0240703 | A1* | 8/2016 | Davidsen | H01L 31/186 |
| 2017/0062633 | A1* | 3/2017 | Carlson | H01L 31/022441 |
| 2018/0138353 | A1* | 5/2018 | Santos Rodriguez | H01L 31/068 |
| 2018/0190919 | A1* | 7/2018 | Schmidt | H01L 31/022425 |

FOREIGN PATENT DOCUMENTS

| | | |
|---|---|---|
| CN | 206595274 | 10/2017 |
| CN | 108461577 | 8/2018 |
| CN | 109216508 | 1/2019 |
| CN | 110400854 | 11/2019 |
| CN | 110534617 | 12/2019 |
| CN | 110854238 | 2/2020 |
| CN | 111029437 | 4/2020 |
| CN | 111326606 | 6/2020 |
| EP | 1026725 | 8/2000 |
| EP | 2413372 | 2/2012 |
| JP | H07161665 | 6/1995 |
| JP | H10256215 | 9/1998 |
| JP | 2000244003 | 9/2000 |
| JP | 2003236829 | 8/2003 |
| JP | 2004111799 | 4/2004 |
| WO | 2020127896 | 6/2020 |

OTHER PUBLICATIONS

Extended European Search Report issued in European counterpart Application No. 20198894.6, issued Mar. 19, 2021.

Baliozian et al., Postmetallization "Passive Edge Technology" for Separated Silicon Solar Cells, IEEE Journal Of Photovoltaics, Mar. 2020, pp. 390-397, vol. 10. No. 2.c.

Office Action issued in corresponding CN Application No. 202010851032.8, issued Mar. 24, 2022, and an English translation thereof, 8 pages.

Decision to Grant issued in corresponding JP Application 2020-161933, issued Mar. 31, 2022, and an English translation thereof, 5 pages.

Office Action issued in corresponding EP Application 20198894.6, issued Jan. 25, 2023, 5 pages.

Koitzsch, M., et al., Enhancements in Resizing Single Crystalline Silicon Wafers up to 450 mm by Using Thermal Laser Separation, from Advanced Semiconductor Manufacturing Conference 2012, pp. 336-341, IEEE 2012.

* cited by examiner

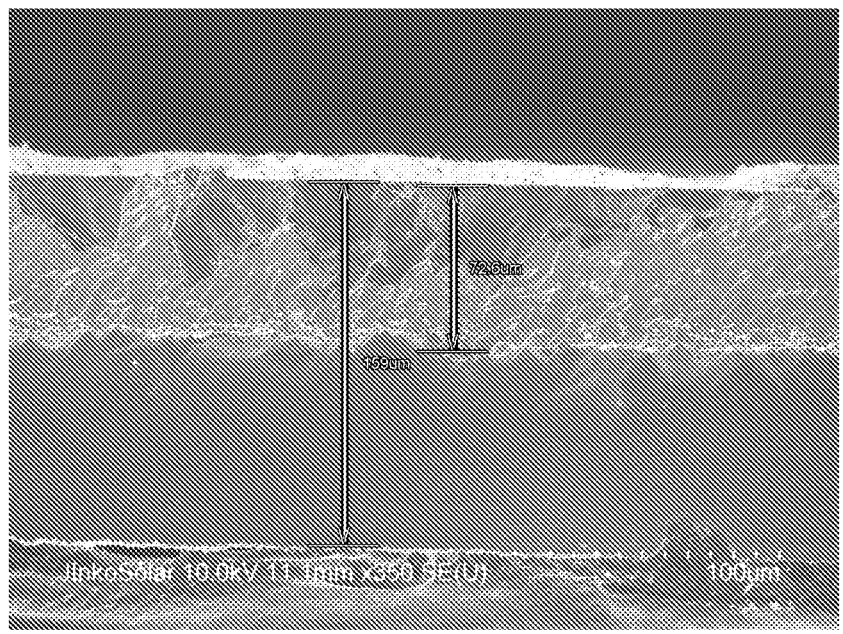

FIG. 2 (Prior art)

Cutting a preset region of the silicon-based semiconductor device by using a cutting process to form a first surface associated with the preset region — S101

Smoothing the first surface to adjust a surface appearance of the first surface, so that a height difference between a protrusion and a recess of a non-marginal region on the first surface is less than 20nm — S102

Passivating the smoothed first surface to form a first passivation layer on the first surface — S103

FIG. 3

METHOD FOR PASSIVATING SILICON-BASED SEMICONDUCTOR DEVICE, AND SILICON-BASED SEMICONDUCTOR DEVICE

CROSS-REFERENCE TO RELATED APPLICATIONS

This application claims priority to and the benefit of CN 202010851032.8, filed on Aug. 21, 2020. The disclosure of the above application is incorporated herein by reference.

FIELD

The present disclosure relates to the technical field of semiconductor devices and, in particular, to a method for passivating a silicon-based semiconductor device and corresponding silicon-based semiconductor device.

BACKGROUND

The statements in this section merely provide background information related to the present disclosure and may not constitute prior art.

A solar cell is a semiconductor device having an energy conversion function based on the semiconductor material and is a core device of solar photovoltaic power generation. The solar cell includes a silicon-based solar cell, which belongs to a silicon-based semiconductor apparatus. In recent years, the photovoltaic power generation technology, as a mainstream technology that utilizes solar energy resources, is important in the development of green energy, and is launched on the market and commercialized. With the continuous progress of the technology, the development trend of photovoltaic module products is focused on the continuous improvement of output power. Researches of related photovoltaic module enterprises focus on increasing the output power per unit area while continuously expanding the area of the photovoltaic module. The most commonly adopted means to achieve a greater power output per unit area is to increase a photoelectric active region. Corresponding assembling technologies are then appeared and widely promoted in the industry, including assembling technologies such as half-cell, shingled structure, and stitch welding. Products manufactured according to these assembling technologies mainly eliminate or reduce inter-string spacing within a solar cell string, increase an effective area, reduce a current of a circuit within the string, and thus reduce a transmission loss of the circuit.

In recent years, photovoltaic modules such as half-cell and lamination have rapidly developed. Preparation of half-cell photovoltaic modules and laminated photovoltaic modules require to cut solar cell wafers. That is, a complete quasi-square cell wafer (with a large/small chamfer) is cut into small cells, the small cells then form a cell string through an in-string interconnection technology, and followed by a series of subsequent module production and manufacturing processes such as string placement, detection, lamination, and border mounting. Currently, a common cutting method mostly includes laser scribing the cell wafer to form gaps and using the manual operation to further break the cell wafer. However, the conversion efficiency of small cells processed by this cutting method is poor.

Therefore, how to provide a cutting method to effectively solve the problem of cell wafer efficiency reduction caused by cutting becomes an urgent technical problem to be solved by those skilled in the art.

SUMMARY

This section provides a general summary of the disclosure and is not a comprehensive disclosure of its full scope or all of its features.

The present disclosure provides a method for passivating a silicon-based semiconductor device and a silicon-based semiconductor device, which can reduce or avoid the problem of efficiency reduction caused by cutting the silicon-based semiconductor device and help to obtain a more efficient silicon-based semiconductor device.

According to one aspect of the present disclosure, the present disclosure provides a method for passivating a silicon-based semiconductor device, including the following steps: cutting, by using a cutting process, a preset region of the silicon-based semiconductor device to form a first surface associated with the preset region; smoothing the first surface to adjust a surface appearance of the first surface such that a height difference between a protrusion and a recess of a non-marginal region on the first surface is less than 20 nm; and passivating the smoothed first surface to form a first passivation layer on the first surface.

In one form, the first passivation layer includes at least one of silicon oxide, silicon nitride, silicon carbide, amorphous silicon, gallium oxide, or silicon oxynitride, and the first passivation layer has a thickness no more than 35 nm.

In another form, the smoothing includes bombarding the non-marginal region on the first surface by using high-energy particles; and/or rubbing the first surface by using an appliance having an uneven surface.

In another form, during the smoothing, a temperature of the silicon-based semiconductor device is less than 350° C., and the time duration of the temperature of the silicon-based semiconductor device being greater than 300° C. is no more than 600 seconds.

In another form, the passivating includes: passivating the first surface with at least one of a chemical vapor deposition, a physical vapor deposition, an atomic layer deposition, or an oxidation passivation, wherein during the passivating, a temperature of the silicon-based semiconductor device is less than 450° C., and the time duration of the temperature of the silicon-based semiconductor device being greater than 300° C. is no more than 1200 seconds.

In another form, during the passivating, an oxidizing agent is applied to the first surface to oxidize a silicon substrate of the silicon-based semiconductor device to form a silicon oxide layer having a thickness of less than or equal to 10 nm on the first surface, wherein a temperature of the oxidization treatment is in a range from 150° C. to 250° C., and the time duration of the oxidation treatment is no more than 30 min; or the first surface is passivated by ozonation to form silicon oxide having a thickness of less than or equal to 8 nm on the first surface.

In another form, a gas mixture of ammonia and silane for preparing the first passivation layer is introduced by the chemical vapor deposition, silicon nitride having a thickness in a range from 5 nm to 35 nm is deposited on the first surface, and silicon nitride is partially deposited on a second surface and a third surface of the silicon-based semiconductor device.

In another form, annealing the first surface after the first surface is passivated, a temperature of the annealing is in a range from 200° C. to 500° C., and the time duration of the temperature of the silicon-based semiconductor device being greater than 430° C. is less than 40 seconds; and the time duration of the annealing is no more than 10 min.

According to another aspect of the present disclosure, the present disclosure provides a silicon-based semiconductor device, including a first surface formed by cutting a preset region of the silicon-based semiconductor device and associated with the preset region, wherein a height difference between a protrusion and a recess of a non-marginal region on the first surface is less than 20 nm, and a first passivation layer is formed on the first surface, and the first passivation layer has a thickness no more than 35 nm.

In another form, the first passivation layer includes at least one of silicon oxide, aluminum oxide, silicon nitride, silicon carbide, amorphous silicon, gallium oxide, or silicon oxynitride.

In another form, the first passivation layer is silicon oxide, and the thickness of the first passivation layer is less than or equal to 10 nm.

In another form, the first passivation layer is hydrogen-containing silicon nitride, and the thickness of the first passivation layer is in a range from 5 nm to 35 nm.

In another form, the device further includes: a second surface facing sunlight during the silicon-based semiconductor is on regular operation; and a third surface opposite to the second surface, wherein components of the first passivation layer are partially deposited on the second surface and the third surface.

In another form, the device further includes: a fourth surface and a fifth surface that intersect with the first surface, the second surface and the third surface, respectively, wherein the fourth surface and the fifth surface are opposite to each other; and a second passivation layer is formed on the fourth surface and the fifth surface, respectively, and the second passivation layer includes silicon nitride or silicon oxynitride.

In another form, the second passivation layer includes aluminum and the second passivation layer has a thickness of no less than 100 nm.

In another form, the device further includes: a sixth surface opposite to the first surface, wherein a height difference between a protrusion and a recess of a non-marginal region on the sixth surface is less than 20 nm, and a third passivation layer is formed on the sixth surface, and the third passivation layer has a thickness no more than 35 nm.

In another form, the device further includes: a sixth surface opposite to the first surface, wherein a height difference between a protrusion and a recess of a non-marginal region on the sixth surface is less than 20 nm, and a third passivation layer is formed on the sixth surface, the third passivation layer includes silicon nitride or silicon oxynitride, and the third passivation layer has a thickness no less than 100 nm.

Compared with the related art, the technical solutions provided by the present disclosure may achieve the following beneficial effects.

The method for passivating a silicon-based semiconductor device provided by the present disclosure includes cutting, by using a cutting process, a preset region of the silicon-based semiconductor device to form a first surface associated with the preset region; and smoothing the first surface to adjust a surface appearance of the first surface, and removing a defected layer or surface particles. The defected layer or surface particles may be introduced by a cutting process. For example, high-temperature laser may lead to the formation of a heat-affected zone on the first surface, exposing the silicon base (silicon substrate) with few lattice defects. Smoothing may change the lattice form and micro-appearance of a non-marginal region on the first surface, and make a height difference between a protrusion and a recess of the non-marginal region on the first surface less than 20 nm, so that the surface appearance of the non-marginal region on the first surface is close to a flat plane, the surface area is significantly reduced, and crack protrusions are almost invisible. Afterward, the smoothed first surface is passivated to form a first passivation layer on the first surface. In this way, surface dangling bonds of a fracture surface may be passivated through the first passivation layer, to prevent the corrosion of external elements such as oxygen and water in the air, eliminate defect and recombination centers, and improve the efficiency of the silicon-based semiconductor device.

The silicon-based semiconductor device in the present disclosure has relatively high conversion efficiency, which is based on the same invention concept as the method for passivating a silicon-based semiconductor device described above, and therefore has at least all the characteristics and advantages thereof, which will not be repeated here.

It is appreciated that, the general description above and the detailed description below are merely exemplary and shall not be interpreted as limitations to the present disclosure.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which:

FIG. 2 illustrates an SEM image of a cutting surface of a cell wafer obtained by using a conventional cutting method;

FIG. 3 is a schematic flowchart of a method for passivating a silicon-based semiconductor device according to an exemplary form of the present disclosure;

Figure 1:
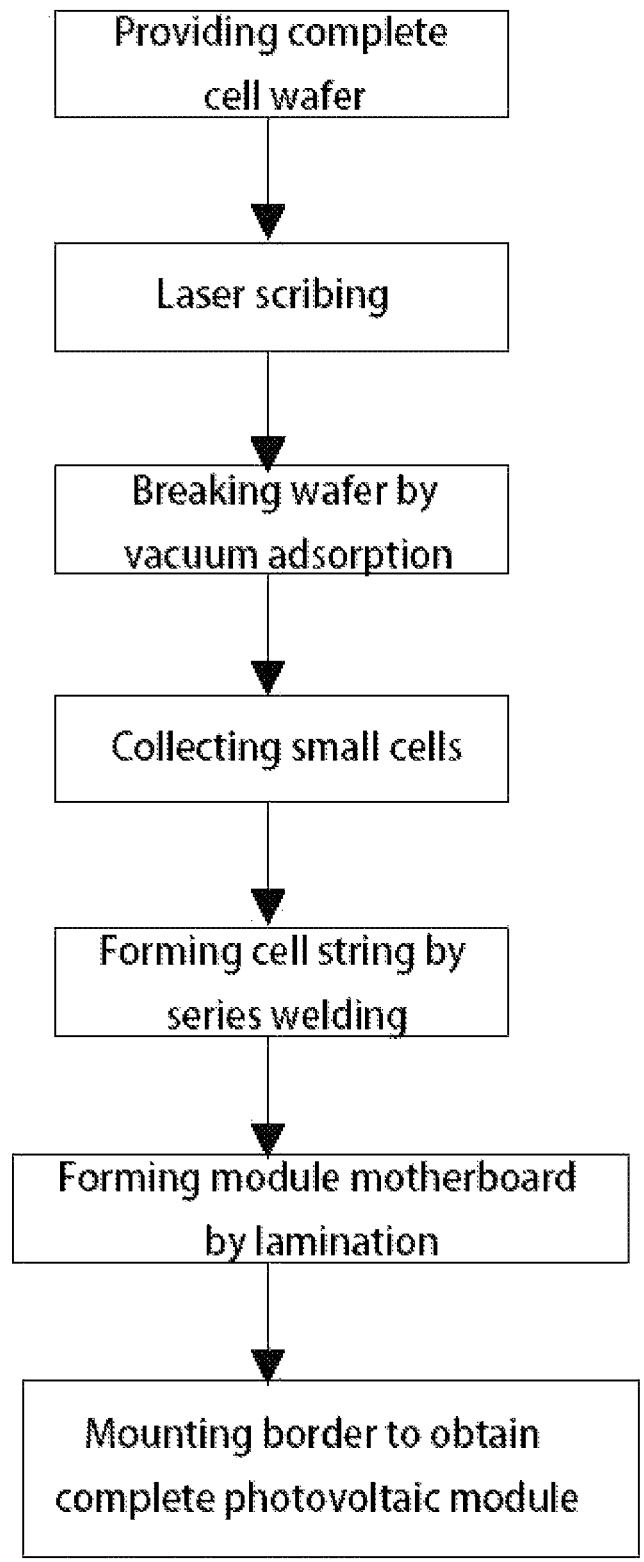
FIG. 1 is a flowchart of a preparation process of a photovoltaic module in the related art.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

In order to make the objectives, technical solutions, and advantages of the present disclosure clearer, the present disclosure is described in further detail below with reference to the accompany drawings and forms. It is appreciated that, specific forms described herein are intended only to describe the present disclosure and are not intended to limit the present disclosure.

It is appreciated that, direction terms such as "above", "below", "inside", and "outside" described in the forms of the present disclosure are illustrated from the perspective shown in the accompany drawings and shall not be construed as limiting the forms of the present disclosure. In addition, it is further appreciated that, when one element is connected "above" or "below" another element, it may be directly connected "above" or "below" the other element, and may also be indirectly connected "above" or "below" the other element through an intermediate element. The singular forms "a", "an", "said", and "the" used in the forms of the present disclosure and the appended claims are also intended to include the plural forms thereof, unless the context clearly indicates other meanings. The term "and/or" is simply an association describing an associated object. It means that there may be three relationships, for example, A and/or B may indicate three situations: A exists alone, both A and B exist, and B exists alone.

Unless otherwise specified, all the technical features and preferred features mentioned herein may be combined with each other to form new technical solutions. Unless otherwise defined or explained, the professional and scientific terms used herein have the same meanings as those familiar to those skilled in the art.

In the present disclosure, unless otherwise described, the numeric range "a-b" represents a thumbnail representation of any combination of real numbers between a and b and includes a and b, both of a and b are real numbers. For example, the numerical range of "150-250" means that all real numbers between "150-250" have been listed herein, and "150-250" is only a thumbnail representation of combinations of the numbers. The "range" disclosed in the present disclosure may be in the form of a lower limit and an upper limit, and may be one or more lower limits and one or more upper limits, respectively.

In the forms of the present disclosure, a silicon-based semiconductor device may be a silicon-based solar cell wafer, referred to as a solar cell wafer or a cell wafer.

As shown in FIG. 1, a preparation process of a photovoltaic module includes: providing a complete cell wafer, laser scribing, breaking the wafer by vacuum adsorption, collecting small cells, forming a cell string by series welding, forming a module motherboard by lamination, and then mounting a border to obtain a complete photovoltaic module. In this preparation process of the photovoltaic module, cell wafer cutting is a crucial process. For a half-cell photovoltaic module, each cell wafer needs to be cut only once, while for shingled and stitch-welded modules, the cell wafer needs to be cut two or more times to form required long strip-shaped small cells. Most of the small cells all have two long sides as cutting edges. A cell wafer cutting process is carried out mostly by using laser scribing to form gaps and by using manual operations to further break the wafer. At the same time, it is observed that the conversion efficiency of the small cells obtained by this cutting method is reduced. At present, there is no mature solution to solve the problem of efficiency reduction of cell wafers caused by cutting.

Exemplarily, FIG. 2 illustrates an SEM image of a cutting surface of a cell wafer obtained by using an existing cutting method. The upper part is a region melted after laser cutting. It can be seen that due to the high energy density of the laser, the central temperature is extremely high (up to about 1000° C.), a silicon base surface is already burned and melted by the high temperature, presenting a very rough appearance. At the same time, a crystal lattice of an exposed silicon base region is already destroyed by the high temperature, presenting an amorphous form and becoming a recombination center. The lower part is a fracture region caused by physical wafer breaking. Since forces with different magnitudes and/or different directions are exerted on both sides of laser scratches during the wafer breaking, a cross section of the fracture region is relatively smooth, but there are small cracks and surface particles, which are prone to hidden cracks and other problems in the subsequent manufacturing steps. Meanwhile, there are a lot of dangling bonds on an exposed silicon base surface, and the recombination of the silicon base surface is intensified. The exposed silicon base surface may also be corroded by pollutants in the surrounding environment to form a new recombination center, thereby resulting in a significant reduction in the efficiency of the small cells.

To resolve the issues mentioned above, a method for passivating a silicon-based semiconductor device is provided, so as to achieve a reduction in cutting loss of the silicon-based semiconductor device, which reduces the formation of recombination centers by smoothing and passivating a cutting surface of the silicon-based semiconductor device, and improves the efficiency of the silicon-based semiconductor device.

In a first aspect, FIG. 3 illustrates a method for passivating a silicon-based semiconductor device according to a form of the present disclosure, the method includes the following steps:

S101: cutting a preset region of the silicon-based semiconductor device by a cutting process to form a first surface associated with the preset region;

S102: smoothing the first surface to adjust a surface appearance of the first surface, so that a height difference between a protrusion and a recess of a non-marginal region on the first surface is less than 20 nm; and S103: passivating the smoothed first surface to form a first passivation layer on the first surface.

In some forms, the silicon-based semiconductor device may include but not limited to an N-type solar cell, a P-type solar cell, a bifacial solar cell, a rear-contact solar cell, a heterojunction solar cell, a PERC (Passivated Emitter and Rear Cells), a TOPCon (Tunnel Oxide Passivated Contact) solar cell, a HIT (Heterojunction with intrinsic Thinlayer) solar cell, and so on.

The passivated silicon-based semiconductor devices may be electrically connected in serial or parallel so as to manufacture half-cell photovoltaic modules, shingled photovoltaic modules, and stitch-welded photovoltaic modules.

In some forms, the preset region may refer to a to-be-cut region. Generally, the preset region is parallel or orthogonal to a main grid line of the silicon-based semiconductor device (e.g., a solar cell).

In some forms, the first surface may be a cutting surface or a fracture surface, and the first surface includes a marginal region and a non-marginal region. The non-marginal region is a cutting surface of a region of an exposed silicon substrate (a silicon-based semiconductor substrate or a silicon substrate), while the marginal region may be a cutting surface of a region including a silicon base region with the silicon substrate close to a second surface and/or a third surface for 1 micron and covering other layered bodies (such as a passivation layer or an oxide layer) on the silicon substrate.

In some forms, the first surface formed by the cutting process is uneven, with a large surface roughness and with protrusion and recess structures. In particular, a height difference between a protrusion and a recess in the non-marginal region on the first surface is much larger than 20 nm before the smoothing process. The height difference between the protrusion and the recess may be a height difference between the highest point of the protrusion and the lowest point of the recess. In the present disclosure, the range of a height difference between a protrusion and a recess in the marginal region on the first surface is not limited.

The method for passivating a silicon-based semiconductor device includes: cutting a preset region of the silicon-based semiconductor device by a cutting process to form a first surface associated with the preset region; and smoothing the first surface to adjust a surface appearance of the first surface, and removing a defected layer or surface particles. The defected layer or surface particles may be introduced by a cutting process. For example, high temperature laser may lead to formation of a heat-affected zone on the first surface, thus exposing a silicon substrate with few lattice defects. The smoothing makes a height difference between the protrusion and the recess of the non-marginal region on the first surface less than 20 nm, so that the surface appearance of the non-marginal region on the first surface is close to a flat plane, the surface area is significantly reduced, and crack protrusions are almost invisible. Afterwards, the smoothed first surface is passivated to form a first passivation layer on the first surface. Surface dangling bonds of a fracture surface may be passivated through the first passivation layer, to prevent the corrosion of external elements such as oxygen and water in the air, eliminate defect and recombination centers, and improve the efficiency of the silicon-based semiconductor device.

After cutting the silicon-based semiconductor device, an exposed fracture surface of the silicon substrate is treated to change the lattice form and micro-appearance of the surface. Meanwhile, the fracture surface of the silicon-based semiconductor device after treatment is passivated, and the surface dangling bonds of the fracture surface are passivated through the passivation layer. Due to the elimination of a laser thermal damage region in a melted state, the fracture surface will be composed of regularly arranged monocrystalline silicon lattices. At the same time, the roughness of the fracture surface will be significantly reduced, and the exposed surfaces are covered by the passivation layers, so as to eliminate the recombination centers of the fracture surface and thus improve the efficiency of the cell wafer. Moreover, by defining the height difference between a protrusion and a recess in the non-marginal region (a cutting surface of a silicon substrate region) on the first surface to be less than 20 nm, for example, less than or equal to (≤) 18 nm, or ≤15 nm, or ≤10 nm, or ≤5 nm, or ≤2 nm, the surface appearance of the non-marginal region of the first surface may be close to a flat plane, the surface roughness of the region is greatly reduced, a surface area of the region is reduced, and the possibility of forming defects and recombination centers is reduced or even avoided, which is conducive to the subsequent passivation treatment and easier to improve the conversion efficiency of the cell.

Exemplarily, in step S101, the cutting of the silicon-based semiconductor device is completed mainly by a cutting process.

The cutting process may be implemented by a thermal treatment process. For example, thermal treatment process provides a certain amount of heat (thermal gradient) in a preset region of a to-be-cut silicon-based semiconductor device. Exemplarily, heating may be completed by using a variety of technologies, such as conduction, convection, radiation, and any combinations thereof. The conduction may be conduction through a heating plate or other contact devices or by use of fluid and/or gas. The radiation may include a heating lamp, a flash lamp, a laser lamp, a quick heating device lamp, and so on.

Thermal treatment process may produce a certain amount of heat or high temperature, there may be various manners of producing the heat. The specific operation manner of thermal treatment process is not limited herein, as long as it can provide a certain amount of heat to a to-be-cut region of the to-be-cut silicon-based semiconductor device or let it melted, to form a cutting section, or produce a temperature difference through cold and heat treatment to form stress cutting, and will not limit the scope of the present disclosure.

In some forms, the cutting process may be a laser cutting process, that is, the cutting process may be implemented by using laser to provide energy for cutting. By using laser, the to-be-cut region may be formed to allow the energy to be absorbed in a part of the cut region. Various types of laser may be adopted. For example, the laser may be pulsed and/or flashing and/or directed to a space region, or the laser may be ultraviolet light, visible light, infrared light, etc. The present disclosure does not limit the specific type of the laser.

Further, the silicon-based semiconductor device is cut by laser scribing to form gaps and through manual operations to further break the wafer. In addition, the silicon-based semiconductor device may also be cut by cold and hot stress fracture or by other means. Laser cutting is a common cutting method with high cutting efficiency and more accurate positioning.

In some forms, the cutting process may also be implemented by a mechanical cutting process, or an acoustic process, or a combination of laser cutting and mechanical cutting, or electron beam bombardment, or an ion beam, or a high-energy particle beam. Merely for illustration, as used herein, the laser scribing technique may be selected as the cutting process. However, those skilled in the art should understand that the principle of the present disclosure may be implemented in any appropriate cutting process, which is not limited to the described laser cutting process. In addition, for the sake of clarity and conciseness, descriptions of well-known functions, structures, or specific operation manners may be omitted.

Exemplarily, in step S102, mainly the first surface, that is, a cutting section, is smoothed.

When the silicon-based semiconductor device (cell wafer) is cut, generally a fracture surface of the cell wafer after cutting may present two states. Further, the first surface (fracture surface) formed by laser scribing and physical wafer breaking includes a laser melting zone and a stress zone which is relatively smooth but has small cracks. The fracture surface of the cell wafer fractured by the cold and hot stress is smooth, but there are still small cracks and protrusions. Compared with the flat plane, surface areas of the fracture surfaces are all increased to different degrees, leading to a significant increase in surface dangling bonds. At the same time, there are also some damage regions, which are easy to form defects and recombination centers. Therefore, the fracture surfaces need to be first smoothed to change the surface appearance.

The smoothing may be implemented in many manners. For example, the fracture surfaces may be smoothed by means of physical polishing and etching. The physical polishing may be carried out by means of grinding. For example, a fracture surface is rubbed through an appliance with an uneven surface such as an uneven high rigidity tool to become even and smooth. The etching may be achieved by bombarding the fracture surface through a high-energy particle beam. In a low-pressure vacuum environment, etching gas may be used to generate a high-density high-energy particle beam by coupling glow discharge, which is applied to the cutting surface of the cell wafer through a vacuum pump to etch a part of the rough surface to make the cutting surface more level. An ion beam generated by ion sources such as helium (He), neon (Ne), and gallium (Ga) may also be used to be converged on a silicon wafer fracture surface after being accelerated by an accelerating electric field.

In some forms, the smoothing includes bombarding the non-marginal region on the first surface by high-energy particles; and/or rubbing the first surface by an appliance with an uneven surface. That is, the first surface may be smoothed by means of high-energy particle bombardment, or smoothed by means of an uneven appliance, or smoothed by means of a combination of high-energy particle bombardment and an uneven appliance. The above high-energy particle bombardment needs to be carried out in a low-pressure vacuum environment. The ion sources include, but are not limited to, helium (He), neon (Ne), and gallium (Ga), and other ion sources may also be used, which are not described in detail here.

In the smoothing process, the non-marginal region on the first surface may be smoothed, or the non-marginal region and the marginal region on the first surface, that is, the entire first surface, may be smoothed, which is not limited by the present disclosure.

Figure 4:
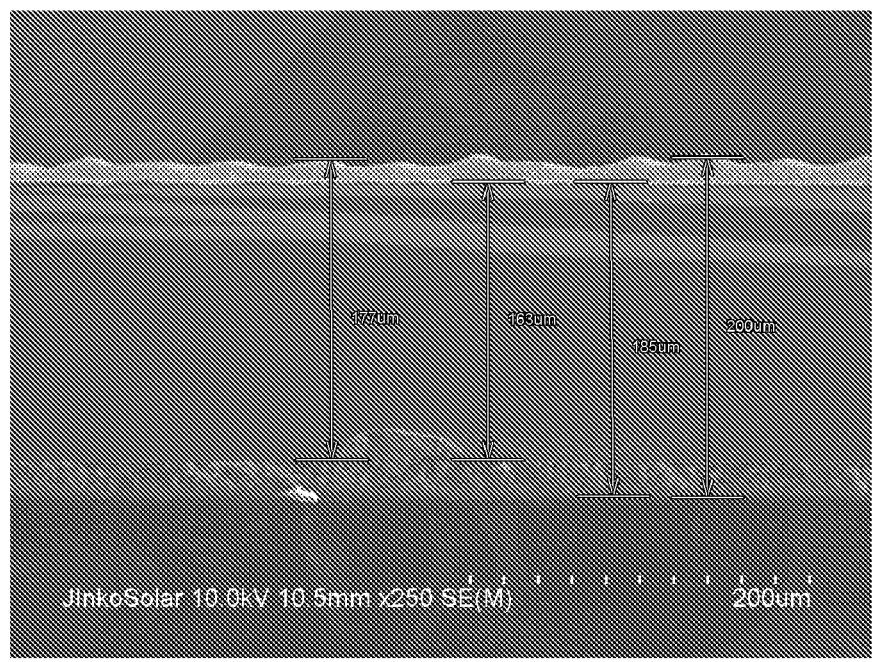
FIG. 4 is a diagram of an SEM cross section of a non-marginal region on a smoothed first surface according to an exemplary form of the present disclosure.

FIG. 4 illustrates a diagram of an SEM cross section of a non-marginal region on a smoothed first surface. It can be seen that the cross section after the smoothing is even and smooth, the surface appearance is close to a flat plane, a surface area is significantly reduced, and crack protrusions are almost invisible.

In some forms, during the smoothing, a temperature of the silicon-based semiconductor device is less than 350° C. Exemplarily, the temperature of the silicon-based semiconductor device or an ambient temperature of a chamber in which the silicon-based semiconductor device is located is <350° C., 330° C., or 310° C. Moreover, the time during which the temperature of the silicon-based semiconductor device is greater than 300° C. is no more than 600 seconds. For example, the time during which the temperature of the silicon-based semiconductor device or the ambient temperature of the chamber in which the silicon-based semiconductor device is located is greater than 300° C. for ≤600 seconds, or ≤500 seconds, or ≤400 seconds, or ≤200 seconds.

The cutting may be performed on a complete silicon-based cell wafer or on a passivated silicon-based cell wafer, and the cell wafer includes structures such as a silicon substrate, an electrode, a diffusion layer and/or a passivation layer, or the cell wafer includes structures such as a silicon substrate, a diffusion layer and/or a passivation layer. Therefore, the treatment temperature should not be too high during the smoothing, that is, it is inappropriate to use a high temperature process for surface smoothing treatment, or conducting the surface smoothing treatment for a long period of time, so as not to cause damage to the formed silicon-based solar cell.

Under smoothing conditions that the above temperature is less than 350° C. and the time duration of the temperature being higher than 300° C. is no more than 600 seconds, the non-marginal region of the first surface can be made even and smooth, the surface appearance is close to a flat plane, and damage to the silicon-based solar cell is effectively avoided.

Exemplarily, in step S103, mainly the first surface, that is, the cutting section, is passivated.

In some forms, the first passivation layer includes, but is not limited to, any one or combinations of silicon oxide, silicon nitride, silicon carbide, amorphous silicon, gallium oxide, or silicon oxynitride, and a thickness of the first passivation layer is no more than (≤) 35 nm.

After the first surface is smoothed, the surface appearance is a smooth plane, and the first surface may be covered with a thin first passivation layer. The first passivation layer may be any monofilm of silicon oxide, silicon nitride, silicon carbide, amorphous silicon, gallium oxide, or silicon oxynitride, or any two or more laminated films of silicon oxide, silicon nitride, silicon carbide, amorphous silicon, gallium oxide, or silicon oxynitride. It is appreciated that, in other forms, the first passivation layer may also be other types of passivation layers. The present disclosure does not limit the specific material of the first passivation layer. The above first passivation layer may produce a good passivation effect on the fracture surface, which is helpful to improve the conversion efficiency of the cell.

The thickness of the first passivation layer is no more than (≤) 35 nm. For example, the thickness of the first passivation layer may be in the range from 1 nm to 35 nm, further in the range from 1 nm to 30 nm, further in the range from 1 nm to 20 nm, and further in the range from 1 nm to 10 nm. The first passivation layer should not be too thick. On the one hand, the cutting may be performed on a complete cell wafer, the cell wafer includes structures such as a silicon substrate, an electrode, a diffusion layer and/or a passivation layer, the formation of the first passivation layer is upon the entire cell, or the cutting may be performed on a passivated cell wafer, and the cell wafer includes structures such as a silicon substrate, a diffusion layer and/or a passivation layer. Therefore, a treatment temperature should not be too high when the fracture surface is passivated, that is, it is inappropriate to use a high temperature for the passivation process, or to conduct the passivation treatment for a long period of time, so as not to cause damage to a silicon-based solar cell. Therefore, the range of the thickness of the thin first passivation layer, especially the range of the thickness of the first passivation layer being ≤35 nm, is conducive to the formation at a low temperature and in a short time, which can avoid damage to the silicon-based solar cell. On the other hand, in the range of the thickness of the thin first passivation layer, especially in the range of the thickness of the first passivation layer being ≤35 nm, the first passivation layer may not affect passivation effects of films on other surfaces of the cell wafer.

Figure 5:
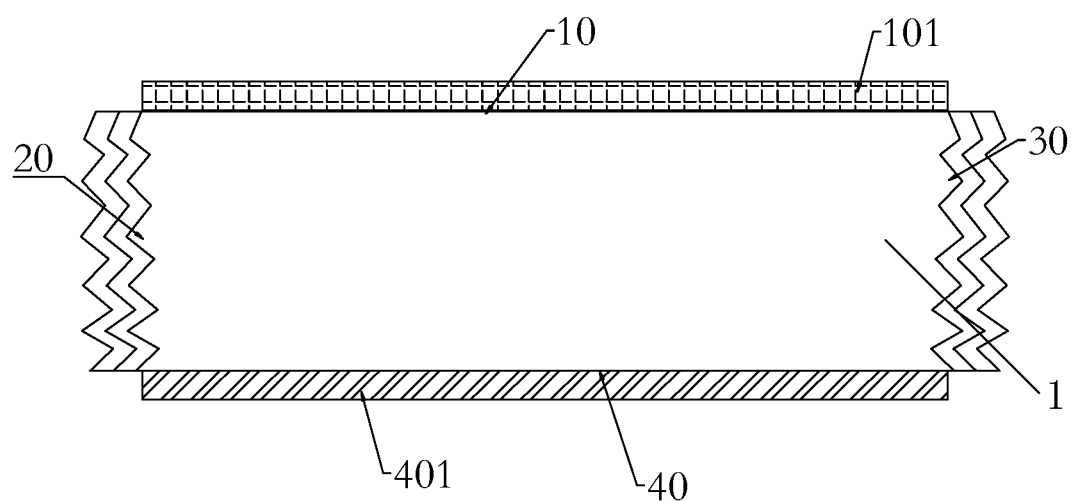
FIG. 5 is a schematic structural diagram of a silicon-based semiconductor device according to an exemplary form of the present disclosure.
Figure 6:
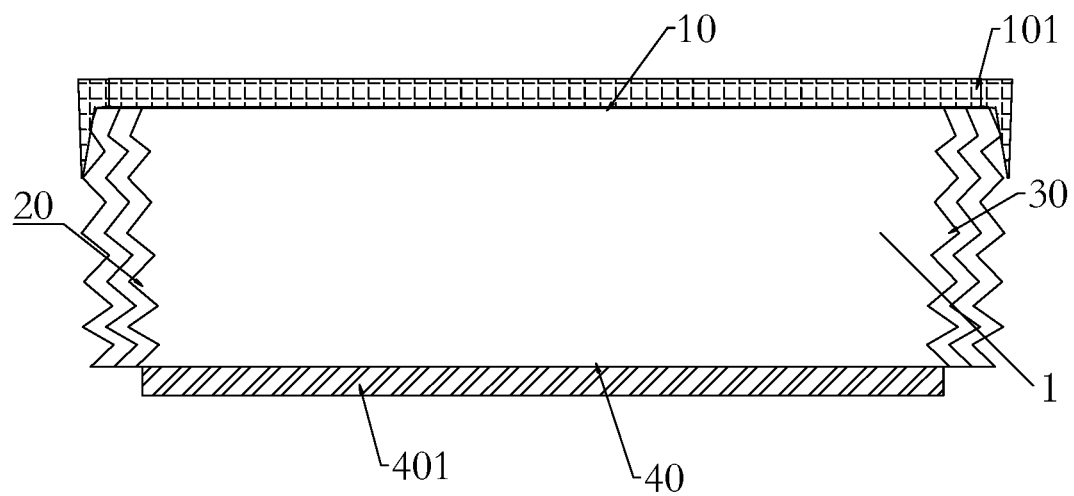
FIG. 6 is a schematic structural diagram of a silicon-based semiconductor device according to another exemplary form of the present disclosure.

Exemplarily, as shown in FIG. 5 or FIG. 6, the cell wafer may include a first surface 10, and may further include a second surface 20 and a third surface 30. The first surface 10 is a cut fracture surface, which may be one side of the cell wafer. The second surface 20 and the third surface 30 may be the front and back of the cell wafer, respectively. The second surface 20 and the third surface 30 are disposed opposite to each other. The second surface 20 is a surface facing the sunlight, that is, a light-receiving surface during a working state of the device, and the third surface 30 is a backlight surface. Generally, a passivation layer and/or an anti-reflection layer are/is already formed on the second surface 20 and/or the third surface 30 prior to the passivating process to the first surface 10. The passivation treatment of the first surface 10 is the passivation treatment to one side of the cell wafer, and it is difficult to avoid the generation of winding plating during the treatment. The term 'winding plating' refers to plating/depositing the untargeted position such as the edges of the opposite surface of the surface to be plated/deposited. Even though the second surface 20 and the third surface 30 are in close contact and have edge-aligned shielding, the winding plating is inevitable during the smoothing and passivating of the first surface 10. Therefore, in order to finally obtain an efficient small cell, during the passivating of the first surface 10, the first passivation layer 101 may not cover or just partially cover the passivation layer and/or the anti-reflection layer on the second surface 20 and the third surface 30, which does not affect the passivation effect of the second surface 20 and the third surface 30. At the same time, since the first passivation layer is thin enough, especially in the range of the thickness of the first passivation layer which is 35 nm, the functions of the passivation layer and/or the anti-reflection layer on the second surface 20 and the third surface 30 may not be affected either.

In some forms, the passivating process includes, but is not limited to, passivating the first surface by means of one or combinations of a chemical vapor deposition (CVD) process, a physical vapor deposition (PVD) process, an atomic layer deposition (ALD) process, and an oxidation passivation process, or further passivating the first surface by a plasma enhanced chemical vapor deposition (PECVD) process. In addition, the passivation treatment may also be replaced with other similar deposition or chemical oxidation processes.

By CVD, PECVD, oxidation, and wet chemistry, a thin first passivation layer is deposited/grown/epitaxial on the first surface. Surface dangling bonds are passivated to prevent the corrosion of external elements such as oxygen and water in the air, so as to eliminate defect centers and improve the efficiency of the cell wafer after cutting.

During the passivating, the temperature of the silicon-based semiconductor device is less than 450° C. Exemplarily, the temperature of the silicon-based semiconductor device or an ambient temperature of the chamber in which the silicon-based semiconductor device is located is <450° C., ≤400° C., or ≤380° C. Moreover, the time duration of the temperature of the silicon-based semiconductor device being greater than 300° C. is less than 1200 seconds. Exemplarily, the time duration of the temperature of the silicon-based semiconductor device or the ambient temperature of the chamber in which the silicon-based semiconductor device is located being greater than 300° C. is <1200 seconds, or ≤1000 seconds, or ≤800 seconds, or ≤600 seconds, or ≤300 seconds.

As described above, the cutting may be performed on a complete cell wafer, the cell wafer includes structures such as a silicon substrate, an electrode, a diffusion layer, or a passivation layer, or the cutting may be performed on a passivated cell wafer, and the cell wafer includes structures such as a silicon substrate, a diffusion layer and/or a passivation layer. The first passivation layer is formed after the cutting process and the smoothing process. Therefore, a treatment temperature should not be too high when the fracture surface is passivated, that is, it is inappropriate to use a high temperature for the passivation process, or to conduct the passivation process for a long period of time, so as not to cause damage to the silicon-based solar cell. Under passivating conditions that the above temperature is less than 450° C. and the time duration of the temperature being above 300° C. is less than 1200 seconds, damage to the silicon-based solar cell may be effectively avoided, it is helpful to eliminate defect centers and improve the efficiency of the cell wafer after cutting.

A material of the first passivation layer may be silicon oxide. The passivating may be oxidation passivation, such as wet oxidation passivation or ozonation passivation. In some forms, during the passivating process, an oxidizing agent is applied to the first surface to oxidize the silicon substrate of the silicon-based semiconductor to form silicon oxide with a thickness of less than or equal to 10 nm on the first surface. The oxidation temperature is in the range from 150° C. to 250° C., and the oxidation time is no more than 30 min.

The applied oxidizing agent may be, for example, a mixture including nitrogen, water vapor, and oxygen. The thickness of the silicon oxide formed may be ≤10 nm, further in the range from 1 nm to 10 nm, further in the range from 1 nm to 8 nm, and further in the range from 1 nm to 5 nm. The oxidation temperature may be in the range from 150° C. to 250° C., further in the range from 150° C. to 230° C., and further in the range from 160° C. to 220° C. The oxidation time may be ≤30 min, further in the range from 1 min to 30 min, further in the range from 5 min to 25 min, and further in the range from 5 min to 20 min.

Alternatively, the first surface may be passivated by ozonation to form silicon oxide with a thickness of less than or equal to 8 nm on the first surface. The thickness of the silicon oxide formed by ozonation may be ≤8 nm, further in the range from 0.1 nm to 8 nm, and further in the range from 0.5 nm to 5 nm.

After the smoothing, for example, high-energy particle beam bombardment, of the first surface, ozone may be sprayed on the first surface. At this time, the cell wafer is still in a low-pressure vacuum chamber and is not taken out to come into contact with the air, so as to prevent the oxygen in the air from producing a natural oxide layer with extremely poor quality on the silicon base surface. Ozone is a strong oxidizing agent, which can quickly complete the oxidation process and generate dense and thin silicon oxide on the surface of the cross section. Due to the presence of silicon oxide, further contact between the ozone and the silicon group is prevented, so after the formation of the dense oxide layer, the ozone and the silicon group cannot further react. The thickness of the first passivation layer obtained by the ozonation method is relatively thin, generally in the range from 0.1 nm to 8 nm.

The remaining operating conditions of wet chemical oxidation or the specific operating conditions of ozonation described above may be regulated and controlled according to actual situations, which are not limited by the present disclosure and are not described in detail here.

A material of the first passivation layer may be silicon nitride, and the passivating may be performed by deposition, such as CVD or PECVD. In some forms, a gas mixture of ammonia and silane required for the preparation of the first passivation layer is introduced by chemical vapor deposition, a silicon nitride layer with a thickness from 5 nm to 35 nm is deposited on the first surface, and the silicon nitride may be partially deposited on the second surface and the third surface of the silicon-based semiconductor device.

The thickness of the silicon nitride layer formed by chemical vapor deposition may be in the range from 5 nm to 35 nm, further in the range from 8 nm to 30 nm, and further in the range from 10 nm to 20 nm.

As described above, the passivating treatment to the first surface, such as the chemical vapor deposition, is processed on one side of the cell wafer, and it is difficult to avoid the generation of winding plating during the deposition. Therefore, the chemical vapor deposition of the first surface may result in that the first passivation layer partially covers the passivation layer and/or the anti-reflection layer on the second surface and the third surface, which does not affect the passivation effect of the second surface and the third surface. At the same time, since the first passivation layer is thin enough, especially when the thickness of the first passivation layer is in the range from 5 nm to 35 nm, the functions of the passivation layer and/or the anti-reflection layer on the second surface and the third surface may not be affected either.

The specific operating conditions of the chemical vapor deposition described above may be regulated and controlled according to actual situations, which are not limited by the present disclosure. In addition, other similar deposition methods may also be used instead, which are not described in detail here.

After the first surface is passivated, it may be annealed or not annealed. As an example, the first surface is passivated and then annealed, for example, a light annealing, a thermal treatment annealing, an electric injection annealing or a photothermal combined annealing may be carried out. In some forms, the first surface is annealed after the first surface is passivated. A temperature of the annealing is in the range from 200° C. to 500° C., further in the range from 200° C. to 450° C., and further in the range from 250° C. to 400° C., and the time duration of the temperature of the silicon-based semiconductor device being above 430° C. is less than 40 seconds, such as ≤35 seconds, or ≤30 seconds, or ≤20 seconds.

The time of the annealing is no more than (≤) 10 min. For example, the time of the annealing is in the range from 0.5 min to 10 min, and further in the range from 0.5 min to 8 min.

When the first surface is annealed, the cell wafer may be rapidly annealed in an environment of 200° C. to 500° C. The purpose of the annealing is to change distribution of hydrogen in the cell wafer and passivate dangling bonds or defects on the substrate and the surface by the passivation effect of the hydrogen. Since the battery has been metalized, the annealing time should not be too long. Long-time high temperature treatment may result in electrode oxidation and/or aging and passivation layer failure. Therefore, the annealing time should not be more than 20 min. For example, the annealing time is min. At the same time, an average value of lowering speeds of a temperature curve in a region above 300° C. should be greater than 10° C./s. For example, the average value of the lowering speeds of the temperature curve in the region above 300° C. should be greater than 15° C./s.

When the silicon-based semiconductor device obtained through the method for passivation in the present disclosure is applied to the preparation of a photovoltaic module, small silicon-based semiconductor devices obtained, that is, small cells, may be used for subsequent routine operation steps of module production. For example, the small cells obtained are used for routine operation steps such as series welding. In order to ensure the quality of the photovoltaic module, inefficient or defective cell wafers should be prevented from mixing into the module to cause power mismatch, thus seriously affecting the efficiency of the module. The small cells may be first tested prior to series welding. The testing may be EL testing, PL testing, or IV curve testing. By the testing, cell wafers matching in electrical parameters are further selected for classification to manufacture the photovoltaic module.

Figure 7:
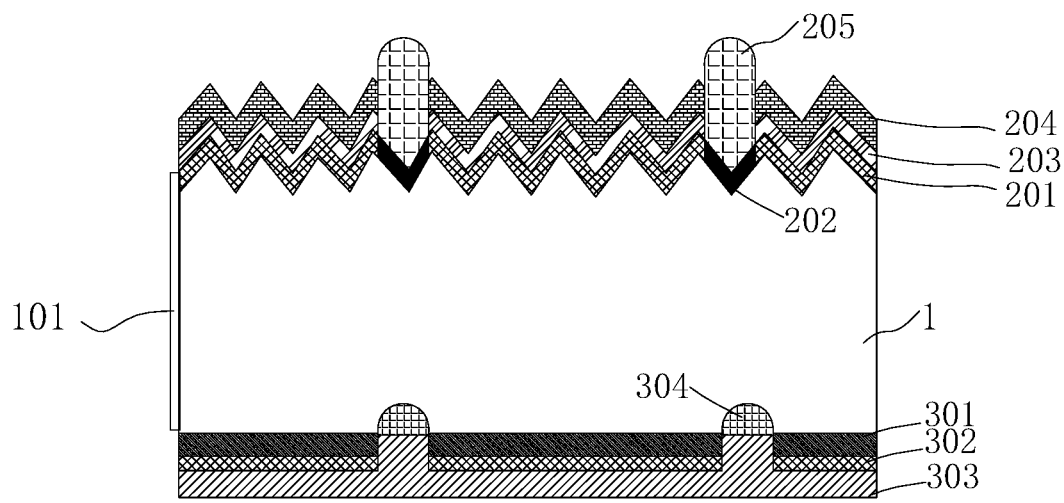
FIG. 7 is a schematic structural diagram of a silicon-based semiconductor device according to another exemplary form of the present disclosure.

In a second aspect, a form of the present disclosure provides a silicon-based semiconductor device, which, as shown from FIG. 5 to FIG. 7, the device includes a first surface 10 formed by cutting a preset region of the silicon-based semiconductor device and associated with the preset region. A height difference between a protrusion and a recess of a non-marginal region on the first surface 10 is less than 20 nm, there is a first passivation layer 101 on the first surface 10, and a thickness of the first passivation layer 101 is no more than 35 nm.

It is appreciated that, the silicon-based semiconductor device in the second aspect of the present disclosure is based on the same invention concept as the method for passivating a silicon-based semiconductor device described above in the first aspect, and therefore the method in this form has at least all the characteristics and advantages of the method for passivating a silicon-based semiconductor device described above, which will not be repeated here. In the silicon-based semiconductor device, the parts the same as or similar to the method for passivating a silicon-based semiconductor device described above may be obtained with reference to the description in the methods described above.

The silicon-based semiconductor device may be a silicon-based semiconductor device obtained after the treatment through the method for passivating a silicon-based semiconductor device described above. By making the height difference between a protrusion and a recess in the non-marginal region (a cutting surface in a silicon substrate region) on the first surface less than 20 nm, for example, less than or equal to (≤) 18 nm, or ≤15 nm, or ≤10 nm, or ≤5 nm, or ≤2 nm, the surface appearance of the non-marginal region of the first surface may be close to a flat plane, the surface roughness of the region is greatly reduced, a surface area of the region is reduced, and the possibility of forming defects and recombination centers is reduced or even avoided, which is conducive to the subsequent passivation treatment and easier to improve the conversion efficiency of the cell. Besides, surface dangling bonds of the fracture surface are passivated through the first passivation layer, and defect centers are eliminated by preventing the corrosion of external elements such as oxygen and water in the air. Due to the elimination of a laser thermal damage region in a melted state, the fracture surface will be composed of regularly arranged mono-crystalline silicon lattices. Meanwhile, the roughness of the fracture surface will be significantly reduced, and passivation layers are covered on exposed surfaces, so as to eliminate recombination centers of the fracture surface and thus improve the efficiency of the cell wafer.

Moreover, the thickness of the above thin first passivation layer, especially the thickness of the first passivation layer is ≤35 nm, which is conducive to the formation at a low temperature and in a short time, which may avoid damage to the silicon-based solar cell, and meanwhile, may make the first passivation layer not affect passivation effects of films on other surfaces (such as the second surface and the third surface) of the cell wafer.

The structure of the silicon-based semiconductor device is suitable for all kinds of cells, and may be applied to any cell wafers after cutting, so that its absolute photoelectric conversion efficiency may be improved by 0.05% to 0.2%. Main electrical parameters of the silicon-based semiconductor device that may be improved include an open-circuit voltage and a filling factor. After experiments, compared with the cell wafer without being treated after cutting, in the silicon-based semiconductor device obtained after the treatment through the method for passivating a silicon-based semiconductor device in the present disclosure, the open-circuit voltage of the cell wafer may be increased by 1 mV to 10 mV, a short-circuit current is increased by 0.01 A to 0.10 A, and FF is increased by 0.1% to 1.5%.

Exemplarily, as shown in FIG. 5, FIG. 6 or FIG. 7, the silicon-based semiconductor device includes a silicon substrate 1. The silicon substrate 1 includes a second surface 20 and a third surface 30 disposed opposite to each other. The second surface 20 is a surface of the silicon-based semiconductor device facing the sunlight during a working state of the device. That is, the second surface 20 may be a light-receiving surface or a front surface, and the third surface 30 may be a back surface. The silicon substrate further includes a first surface 10 on a lateral side of the silicon substrate 1, and a height difference between a protrusion and a recess of a non-marginal region on the first surface 10 is less than 20 nm, there is a first passivation layer 101 on the first surface 10, and a thickness of the first passivation layer 101 is no more than 35 nm.

The silicon substrate 1 may be a P-doped substrate or an N-doped substrate. There is a diffusion layer at the front surface of the silicon substrate 1 which is opposite to the doping manner of the silicon substrate. The diffusion layer and the silicon substrate 1 jointly form a PN junction structure. The surface appearance of the diffusion layer is an extremely uneven textured surface. The textured surface may include a normal pyramid, an inverted pyramid, and a porous rough surface made by RIE (reactive ion etching) or MCT (metal catalyst texturing). The diffusion layer may include a lightly doped layer 201 and a heavily doped layer 202 which corresponds to a metal electrode 205 region. A front passivation layer 203 and a front anti-reflection layer 204 are formed on the diffusion layer. Both the front passivation layer 203 and the front anti-reflection layer 204 may be composed of laminated films. Film components thereof may include substances such as aluminum oxide, silicon oxide, silicon oxynitride, silicon nitride, gallium oxide, silicon carbide, amorphous silicon, and silicon oxycarbide. In addition, materials of the front passivation layer 203 and the front anti-reflection layer 204 may also be of other types, which are not limited in the present disclosure. A rear passivation layer 301, a rear reflection layer 302, a back electrode 303, and a heavily doped rear region 304 are formed on the back surface of the silicon substrate 1. The rear passivation layer 301 may include a first rear passivation layer and a second rear passivation layer. Specific types of the rear passivation layer 301 and the rear reflection layer 302 are not limited in the present disclosure, which are not described in detail here.

Regarding the front passivation layer 203 and the front anti-reflection layer 204 described above, generally, a film directly in contact with the front surface is regarded as a passivation layer, which mainly plays a role of passivating surface dangling bonds and preventing carrier recombination in a surface region. Since the anti-reflection layer above the passivation layer is far away from the silicon base surface, its main purpose is to adjust a refractive index of an entire light-transmitting film and increase an anti-reflection effect for light absorption, even though there may be a partial passivation effect. At the same time, the anti-reflection layer may further protect silicon cells, improve weather resistance, and avoid factors such as oxygen, water, and metal ions in an external environment to enter the silicon cells to result in defects and efficiency attenuation. Therefore, during determination of a surface film structure, a film that mainly plays a role of passivation and is close to the silicon base surface is considered as the passivation layer, while a film above the passivation layer that is not in direct contact with the silicon base is considered as the anti-reflection layer. For example, if the surface structure is a silicon base/silicon oxide/silicon nitride, silicon oxide should be considered as the passivation layer and silicon nitride should be considered as the anti-reflection layer. Similarly, in a passivation structure of aluminum oxide/silicon nitride, silicon oxide/silicon oxynitride, aluminum oxide/silicon oxynitride, the aluminum oxide and silicon nitride should be regarded as a passivation layer, while the silicon nitride and silicon oxynitride should be regarded as the anti-reflection layer. In a structure of silicon oxide/aluminum oxide/silicon nitride, since the aluminum oxide includes high-density negative charges and plays a role of field passivation, silicon oxide/aluminum oxide is regarded as the passivation layer and silicon nitride as the anti-reflection layer.

In addition, there is also a metal electrode 205 on the front surface of the silicon substrate 1. The metal electrode 205 is composed of conductive materials, penetrates through the front anti-reflection layer 204 and the front passivation layer 203 to directly contact the diffusion layer, collect carriers generated by photoelectricity and extract them.

On the back surface of the silicon substrate 1, there may be a heavily doped rear region 304 for forming a back surface field to help the back electrode to collect carriers, or there may be no heavily doped rear region. The collection is carried out only by free movement of built-in electric fields and carriers generated by a PN junction formed by the silicon substrate and the front diffusion layer. The surface appearance of the back of the silicon substrate 1 may be either a wet chemically etched rough surface or a pyramidal textured surface. On the back surface of the silicon substrate 1, there are a rear passivation layer 301, a rear reflection layer 302, and a back electrode 303 which are in close contact with each other. The rear reflection layer 302 and the back electrode 303 are on the rear passivation layer 301 and far away from the silicon substrate 1. Similarly, both the rear passivation layer 301 and the rear reflection layer 302 may be composed of laminated films. Film components thereof may include substances such as aluminum oxide, silicon oxide, silicon oxynitride, silicon nitride, gallium oxide, silicon carbide, amorphous silicon, and silicon oxycarbide.

The rear passivation layer 301 and the rear reflection layer 302 may be functioned in the same manner as the front structure, namely, the passivation layer 203 and the anti-reflection layer 204, which will not be repeated here.

In addition, for some P-type single-side silicon cells, an opaque aluminum back surface field is used as the metal electrode. The aluminum back surface field has the functions of passivation, reflection, and carrier collection. Due to its high-density fixed charges, it has a field passivation effect on the silicon substrate. At the same time, the opaque characteristic of the aluminum back surface field helps to reflect the light from the silicon substrate to the bottom surface of the substrate. Due to the excellent conductivity of the aluminum back surface field, the carriers generated by photoelectricity may be collected and transmitted thereon.

It should be noted that the present disclosure does not limit the specific structure of the silicon-based semiconductor device. FIG. 7 illustrates a structure of the silicon-based semiconductor device. However, in other forms, the silicon-based semiconductor device may also have other structures.

In the silicon-based semiconductor device, there is a first passivation layer 101 on the first surface 10. In some forms, the first passivation layer 101 includes, but is not limited to, any one or any two or combinations of more of silicon oxide, aluminum oxide, silicon nitride, silicon carbide, amorphous silicon, gallium oxide or silicon oxynitride.

In some forms, the first passivation layer 101 is silicon oxide, and a thickness of the first passivation layer 101 is less than or equal to 10 nm. The silicon oxide may be formed by wet a chemical oxidation passivation process or by an ozonation passivation process. A thickness of the silicon oxide may be in the range from 1 nm to 10 nm, further in the range from 1 nm to 8 nm, and further in the range from 1 nm to 5 nm.

In some forms, the first passivation layer 101 is a hydrogen-containing silicon nitride layer, and a thickness of the first passivation layer 101 is in the range from 5 nm to 35 nm. The hydrogen-containing silicon nitride layer may be formed by a chemical vapor deposition process. A desired gas mixture of ammonia and silane may be introduced upon deposition. The thickness of the silicon nitride layer may further be in the range from 5 nm to 35 nm, further in the range from 8 nm to 30 nm, and further in the range from 10 nm to 20 nm.

In some forms, as shown in FIG. 6, components of the first passivation layer 101 are partially deposited on a second surface 20 and a third surface 30 of the silicon-based semiconductor device, the second surface 20 is a surface of the silicon-based semiconductor device facing the sunlight during a working state of the device, and the third surface 30 is a surface opposite to the second surface 20.

As described above, the passivating treatment to the first surface, such as the chemical vapor deposition, is processed on one side of the cell wafer, and it is difficult to avoid the generation of winding plating during the deposition. Therefore, chemical vapor deposition of the first surface may result in that the first passivation layer partially covers the passivation layer and/or the anti-reflection layer on the second surface and the third surface, which does not affect the passivation effect of the second surface and the third surface. At the same time, since the first passivation layer is thin enough, especially the thickness of the first passivation layer is in the range from 5 nm to 35 nm, functions of the passivation layer and/or the anti-reflection layer on the second surface and the third surface may not be affected either.

In some forms, the silicon-based semiconductor device includes: a fourth surface and a fifth surface intersecting with the first surface, the second surface, and the third surface, respectively, and the fourth surface and the fifth surface are opposite to each other.

There is a second passivation layer on the fourth surface and the fifth surface, respectively. The second passivation layer may be a laminated structure. The second passivation layer includes silicon nitride or silicon oxynitride, and may also include other film structures, such as aluminum oxide and/or silicon oxide.

It is appreciated that, the silicon-based semiconductor device as a whole may be substantially a cuboid or cubic shape, which may have six surfaces, including a first surface, a second surface, a third surface, a fourth surface, a fifth surface, and a sixth surface. The first surface is opposite to the sixth surface, the second surface is opposite to the third surface, and the fourth surface is opposite to the fifth surface. The first surface may be the cut fracture surface as described above, the second surface is a front surface, and the third surface is a back surface.

In some forms, the second passivation layer contains aluminum and a thickness of the second passivation layer is no less than (≥) 100 nm. The thickness of the second passivation layer may be in the range from 100 nm to 250 nm, further in the range from 110 nm to 180 nm, and further in the range from 120 nm to 150 nm.

In some forms, as shown in FIG. 5 or FIG. 6, the silicon-based semiconductor device further includes a sixth surface 40 opposite to the first surface 10. A height difference between a protrusion and a recess of a non-marginal region on the sixth surface 40 is less than 20 nm, a third passivation layer 401 is provided on the sixth surface 40, and a thickness of the third passivation layer 401 is no more than 35 nm.

In some other forms, the silicon-based semiconductor device further includes a sixth surface 40 opposite to the first surface 10. A third passivation layer 401 is provided on the sixth surface 40, the third passivation layer 401 includes silicon nitride or silicon oxynitride, and a thickness of the third passivation layer 401 is no less than 100 nm. The thickness of the third passivation layer may be in the range from 100 nm to 250 nm, further in the range from 110 nm to 180 nm, and further in the range from 120 nm to 150 nm. The third passivation layer may be a laminated structure. The third passivation layer includes silicon nitride or silicon oxynitride, and may also include other film structures, such as aluminum oxide and/or silicon oxide.

The sixth surface 40 is a surface disposed opposite to the first surface 10. In some cases, the sixth surface 40 may be a cut fracture surface, and the sixth surface 40 may have a structure the same as or similar to the first surface 10. That is, a height difference between a protrusion and a recess of a non-marginal region on the sixth surface 40 is less than 20 nm, there is a third passivation layer 401 on the sixth surface 40, and the third passivation layer 401 may be the same as or similar to the first passivation layer 101 on the first surface 10. In some other cases, the sixth surface 40 may not be a cut fracture surface, and the sixth surface 40 may have a structure the same as or similar to the fourth surface and the fifth surface. That is, a third passivation layer 401 is provided on the sixth surface 40, and the third passivation layer 401 may be the same as or similar to the second passivation layer on the fourth surface and the fifth surface.

In order to facilitate the understanding of the present disclosure, the method of the present disclosure is further described below in combination with specific forms, but the protection scope of the present disclosure is not limited by the following examples.

Example 1

The first passivation layer is silicon oxide, and may be made by oxidation reaction. Since hot oxygen needs a high temperature, the oxidation reaction may be performed in combination with a surface smoothing step. Specific steps are as follows.

(1) A complete silicon-based semiconductor device is segmented to obtain small silicon-based semiconductor devices.

(2) The small silicon-based semiconductor devices are placed in a low-pressure vacuum environment, and a cross section is bombarded with high-energy particle beam, such as He ions, after accelerating and focusing. In this case, a temperature of a chamber where the silicon-based semiconductor device is located is no more than 350° C.

(3) After the high-energy beam bombardment, nitrogen, water vapor, and oxygen may be sprayed onto the cross section. In this case, the temperature of the silicon-based semiconductor device is in the range from 150° C. to 250° C. Gaseous water vapor and oxygen react with a silicon surface to produce an oxide layer of 1 nm to 10 nm.

(4) After the passivation process is completed, boosting, ventilating and cooling processes are carried out. In this process, an annealing process of newly generated silicon oxide may be completed by controlling a cooling rate, so as to optimize lattice arrangement of a contact surface of a silicon base and silicon oxide and, at the same time, improve the passivation performance of the silicon oxide.

(5) The small silicon-based semiconductor devices are taken out. In this case, the structure of the silicon-based semiconductor device after an efficient cutting process described in the present disclosure is obtained. Routine component manufacturing steps, such as series welding, laminating, and mounting of a border junction box, may be performed.

Example 2

The first passivation layer is silicon oxide, which may be obtained by an ozonation process. Specific steps are as follows.

(1) A complete silicon-based semiconductor device is segmented to obtain small silicon-based semiconductor devices.

(2) The small silicon-based semiconductor devices are placed in a low-pressure vacuum environment, and a cross section is bombarded with a high-energy particle beam, such as He ions, through accelerating and focusing. In this case, a temperature of a chamber where the silicon-based semiconductor device is located is no more than 350° C.

(3) After the high-energy particle beam bombardment, ozone may be sprayed onto the cross section. In this case, the silicon-based semiconductor device is still in the low-pressure vacuum chamber, and is not taken out to come into contact with the air, thereby preventing oxygen in the air from producing a natural oxide layer with extremely poor quality on a silicon base surface. Ozone is a strong oxidizing agent, which may quickly complete the oxidation process and generate thin silicon oxide on the surface of the cross section. Due to the presence of silicon oxide, further contact between the ozone and the silicon group is prevented, so after the formation of the dense oxide layer, the ozone and the silicon group cannot further react. In this case, the silicon oxide obtained is in the range from 1 nm to 8 nm.

(4) After the passivation process is completed, boosting, ventilating and cooling processes are carried out. In this process, an annealing process of newly generated silicon oxide may be completed by controlling a cooling rate, so as to optimize lattice arrangement of a contact surface of a silicon base and silicon oxide and, at the same time, improve the passivation performance of the silicon oxide.

(5) The small silicon-based semiconductor devices are taken out. In this case, the structure of the silicon-based semiconductor device after an efficient cutting described in the present disclosure is obtained. Routine component manufacturing steps, such as series welding, laminating, and mounting of a border junction box, may be performed.

Example 3

The first passivation layer is silicon oxide, which may be obtained by a chemical deposition process. Specific steps are as follows.

(1) A complete silicon-based semiconductor device is segmented to obtain small silicon-based semiconductor devices.

(2) The small silicon-based semiconductor devices are placed in a low pressure vacuum environment, and a cross section is bombarded with a high-energy particle beam, such as He ions or Ne ions, through accelerating and focusing. In this case, a temperature of a chamber where the silicon-based semiconductor device is located is no more than 350° C.

(3) After the high-energy particle beam bombardment, plasma mixed with ammonia and silane are introduced into a surface of the cross section by a chemical vapor deposition process, to complete a deposition process of silicon nitride. A thickness of the silicon nitride may be set according to the reaction time. For example, the thickness of the silicon nitride is in the range from 5 nm to 35 nm. For another example, the thickness of the silicon nitride is in the range from 10 nm and 20 nm.

(4) After the passivation process is completed, boosting, ventilating and cooling processes are carried out. In this process, an annealing process of newly generated silicon oxide may be completed by controlling a cooling rate, so as to optimize lattice arrangement of a contact surface of a silicon base and silicon oxide and, at the same time, hydrogen in silicon oxide may be diffused into the silicon base to complete a hydrogen passivation process, which improves the passivation performance of the silicon oxide.

(5) The small silicon-based semiconductor devices are taken out. In this case, the structure of the silicon-based semiconductor device after an efficient cutting described in the present disclosure is obtained. Nitrogen and silicon elements come from gas atmosphere in the deposition process of silicon nitride. Therefore, a film obtained by deposition has relatively large winding plating, which covers a side (a sixth surface) of a film on the front and back in the direction of the first surface, and may also cover a film in the front and/or back (a second surface and/or a third surface) directions. Routine component manufacturing steps, such as series welding, laminating, and mounting of a border junction box, may be performed.

In addition, when the first passivation layer is made of silicon oxynitride, silicon carbide, and silicon nitride, etc., it may be obtained by a chemical deposition process similar to that in Form 3 described above. Their preparation methods are similar except that the gas source introduced and reaction time are different in step (3). The structure of the silicon-based semiconductor device after an efficient cutting obtained is as described above. The main feature is that the first passivation layer covers the first surface and the sixth surface, and also has winding plating, which makes part of the first passivation layer cover the film on the second surface and the third surface. Since the film thickness of the first passivation layer is small, the first passivation layer will not affect the functionality of the film on the second surface and the third surface.

In a form, the cutting and smoothing happen in one process during the fabrication. This process is conducted by one or more equipment. For one process, the equipment includes a cutting tool and a smoothing tool. During the process, the cell is cut and the first surface is smoothed at the same time or smoothing happened straight after cutting. This kind of process will save space and procedures for the production line.

In a form, the cutting, smoothing, and passivating are integrated into one process during the fabrication. This process is conducted by one or more equipment. The cutting and smoothing are conducted by two function units. The smoothing step starts when the cutting is not finished. And the passivating happened during the smoothing or right after cutting in the same process. The increasing temperature of the cell results from cutting or smoothing creates the possibility for passivating, the precursor of the passivation layer is further needed to form a first passivation layer. By integrating three steps in one fabrication process, space and the resource are saved for mass production.

Based on the above description, it can be known that the present disclosure may reduce a surface area of a fracture surface and dangling bonds, avoid the formation of recombination centers, passivate the dangling bonds, block influences of external environmental factors and the corrosion of modules such as water and oxygen, avoid the reduction of efficiency of the silicon-based semiconductor device due to the cutting, and obtain higher-efficiency small silicon-based semiconductor devices.

The above are merely some exemplary forms of the present disclosure and are not intended to limit the present disclosure. The present disclosure may be subject to changes and variations for those skilled in the art. Any modification, equivalent replacement, and improvement made within the spirit and principles of the present disclosure shall all be encompassed in the protection scope of the present disclosure.

It should be noted that part of the patent application document contains copyrighted content. The copyright owner retains the copyright except by making a copy of the contents of the patent file or the patent document recorded by the Patent Office.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A method for passivating a silicon-based semiconductor device, comprising:
    cutting, by using a cutting process, a to-be-cut region of the silicon-based semiconductor device to form a cutting surface and a first surface adjacent to the cutting surface, wherein the cutting surface extends along a thickness direction of the silicon-based semiconductor device and the first surface extends along a length direction of the silicon-based semiconductor device;
    smoothing the first surface to adjust a surface appearance of the first surface such that a height difference between a protrusion and a recess of a non-marginal region on the first surface is less than 20 nm; and
    passivating the smoothed first surface to form a first passivation layer on the first surface,
    wherein the smoothing comprises:
        bombarding the non-marginal region on the first surface under low pressure vacuum by using high-energy particles,
    wherein the passivating the smoothed first surface to form a first passivation layer on the first surface at least comprises:
        performing passivation over the first surface by ozonation under low pressure vacuum to form a silicon oxide layer having a thickness of less than or equal to 8 nm, and
    wherein the first passivation layer further comprises at least one of silicon nitride, silicon carbide, amorphous silicon, gallium oxide, or silicon oxynitride, and the first passivation layer has a total thickness of no more than 35 nm,
    wherein the method further comprises:
        annealing the passivated first surface after the first surface is passivated;
    wherein a temperature of the annealing is in a range from 200° C. to 500° C., and time duration of the temperature of the silicon-based semiconductor device being greater than 430° C. is less than 40 seconds,
    time duration of the annealing is no more than 10 min, and
    an average value of a lowering speed of a temperature curve of the annealing in a range above 300° C. is greater than 10° C./s.

2. The method for passivating a silicon-based semiconductor device according to claim 1, wherein the smoothing comprises:
    rubbing the first surface by an appliance having an uneven surface.

3. The method for passivating a silicon-based semiconductor device according to claim 1, wherein during the smoothing, a temperature of the silicon-based semiconductor device is less than 350° C., and time duration of the temperature of the silicon-based semiconductor device being greater than 300° C. is no more than 600 seconds.

4. The method for passivating a silicon-based semiconductor device according to claim 2, wherein during the smoothing, a temperature of the silicon-based semiconductor device is less than 350° C., and time duration of the temperature of the silicon-based semiconductor device being greater than 300° C. is no more than 600 seconds.

5. The method for passivating a silicon-based semiconductor device according to claim 1, wherein in addition to the ozonation, the passivating further comprises:
    passivating the first surface with at least one of a chemical vapor deposition, a physical vapor deposition, or an atomic layer deposition, wherein during the passivating, a temperature of the silicon-based semiconductor device is less than 450° C., and time duration of the temperature of the silicon-based semiconductor device being greater than 300° C. is no more than 1200 seconds.

6. The method for passivating a silicon-based semiconductor device according to claim 5, wherein during the passivating, an oxidizing agent is applied to the first surface to oxidize a silicon substrate of the silicon-based semiconductor device to form silicon oxide on the first surface, wherein a temperature of the oxidization treatment is in a range from 150° ° C. to 250° C., and time duration of the oxidation treatment is no more than 30 min.

7. The method for passivating a silicon-based semiconductor device according to claim 5, wherein a gas mixture of ammonia and silane for preparing the first passivation layer is introduced during the chemical vapor deposition, the silicon nitride having a thickness in a range from 5 nm to 35 nm 8 nm to 30 nm is deposited on the first surface, and silicon nitride is partially deposited on a second surface and a third surface of the silicon-based semiconductor device.

8. A silicon-based semiconductor device passivated by the method according to claim 1.

9. The silicon-based semiconductor device according to claim 8, further comprising: a second surface facing sunlight when the silicon-based semiconductor is in regular operation; and a third surface opposite to the second surface, wherein components of the first passivation layer are partially deposited on the second surface and the third surface.

10. The silicon-based semiconductor device according to claim 9, further comprising:
a fourth surface and a fifth surface that intersect with the first surface, the second surface and the third surface, respectively,
wherein the fourth surface and the fifth surface are opposite to each other, and
a second passivation layer is formed on the fourth surface and the fifth surface, respectively, and the second passivation layer comprises silicon nitride or a silicon oxynitride.

11. The silicon-based semiconductor device according to claim 10, wherein the second passivation layer comprises aluminum and the second passivation layer has a thickness no less than 100 nm.

12. The silicon-based semiconductor device according to claim 8, further comprising:
a sixth surface opposite to the first surface,
wherein a height difference between a protrusion and a recess of a non-marginal region on the sixth surface is less than 20 nm, and
a third passivation layer is formed on the sixth surface, and the third passivation layer has a thickness no more than 35 nm.

13. The silicon-based semiconductor device according to claim 8, further comprising:
a sixth surface opposite to the first surface,
wherein a height difference between a protrusion and a recess of a non-marginal region on the sixth surface is less than 20 nm, and
a third passivation layer is formed on the sixth surface, the third passivation layer comprises silicon nitride or silicon oxynitride, and the third passivation layer has a thickness no less than 100 nm.

14. The method for passivating a silicon-based semiconductor device according to claim 1, further comprising:
cutting a silicon rod into a plurality of silicon wafers; and
cutting the silicon wafers into silicon sub-wafers along a thickness direction of the silicon wafers to form a plurality of silicon-based semiconductor devices.

15. The method for passivating a silicon-based semiconductor device according to claim 1, wherein the silicon oxide layer has a thickness in a range of 1 nm to 5 nm.

16. The method for passivating a silicon-based semiconductor device according to claim 1, wherein the average value of the lowering speed of the temperature curve of the annealing in the range above 300° C. is greater than 15° C./s.

* * * * *